United States Patent [19]

Fox

[11] 4,455,677
[45] Jun. 19, 1984

[54] MULTIPURPOSE HEADPHONE ASSEMBLY

[76] Inventor: Shaffer W. Fox, 510 E. Oliver St., Owosso, Mich. 48867

[21] Appl. No.: 382,653

[22] Filed: May 27, 1982

[51] Int. Cl.³ ............................................. H04M 1/19
[52] U.S. Cl. ...................................... 381/110; 381/95; 179/156 R
[58] Field of Search ............ 179/156 R, 1 P, 15.55 R, 179/156 A, 182 R, 1 GA; 381/93, 94, 95, 96, 110

[56] References Cited

U.S. PATENT DOCUMENTS

| | | | |
|---|---|---|---|
| 3,098,121 | 7/1963 | Wadsworth | 179/1 P |
| 3,098,367 | 7/1963 | Caldwell, Jr. | 179/156 R |
| 3,952,158 | 4/1976 | Kyle et al. | 179/1 P |
| 4,006,310 | 2/1977 | Bayer | 179/1 P |
| 4,061,874 | 12/1977 | Fricke et al. | 179/1 P |
| 4,132,861 | 1/1979 | Frieder, Jr. et al. | 179/1 P |

FOREIGN PATENT DOCUMENTS

| | | | |
|---|---|---|---|
| 2056437 | 5/1972 | Fed. Rep. of Germany | 179/156 A |
| 56-10793 | 2/1981 | Japan | 179/156 R |
| 1596195 | 8/1981 | United Kingdom | 179/156 R |

Primary Examiner—Harold I. Pitts
Assistant Examiner—Robert Lev
Attorney, Agent, or Firm—George R. Royer

[57] ABSTRACT

A multipurpose electronic assembly for a headphone assembly used in connection with a stereophonic system, such system comprising detection and signal means to ascertain noises extraneous to the stereophonic output system. Such assembly comprises a pick-up microphone in one or more speaker assembly for such ambient sound pick-up. The pick-up microphone is connected to an automatically actuated switch which closes whenever the pick-up microphone detects certain ambient sounds extraneous to the system. The latter automated switch assembly is directly interconnected with a voice compressor assembly, and then directly to an amplifier to provide minimal amplification of such extraneous sounds.

1 Claim, 3 Drawing Figures

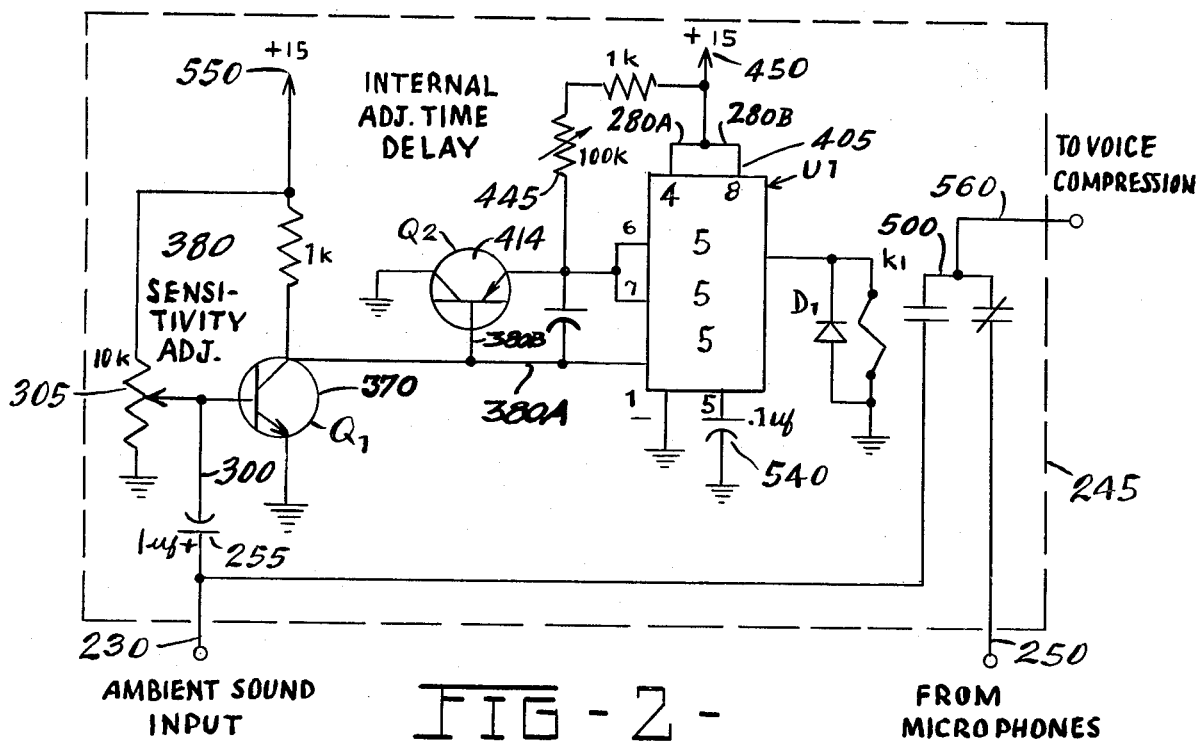
FIG-2-
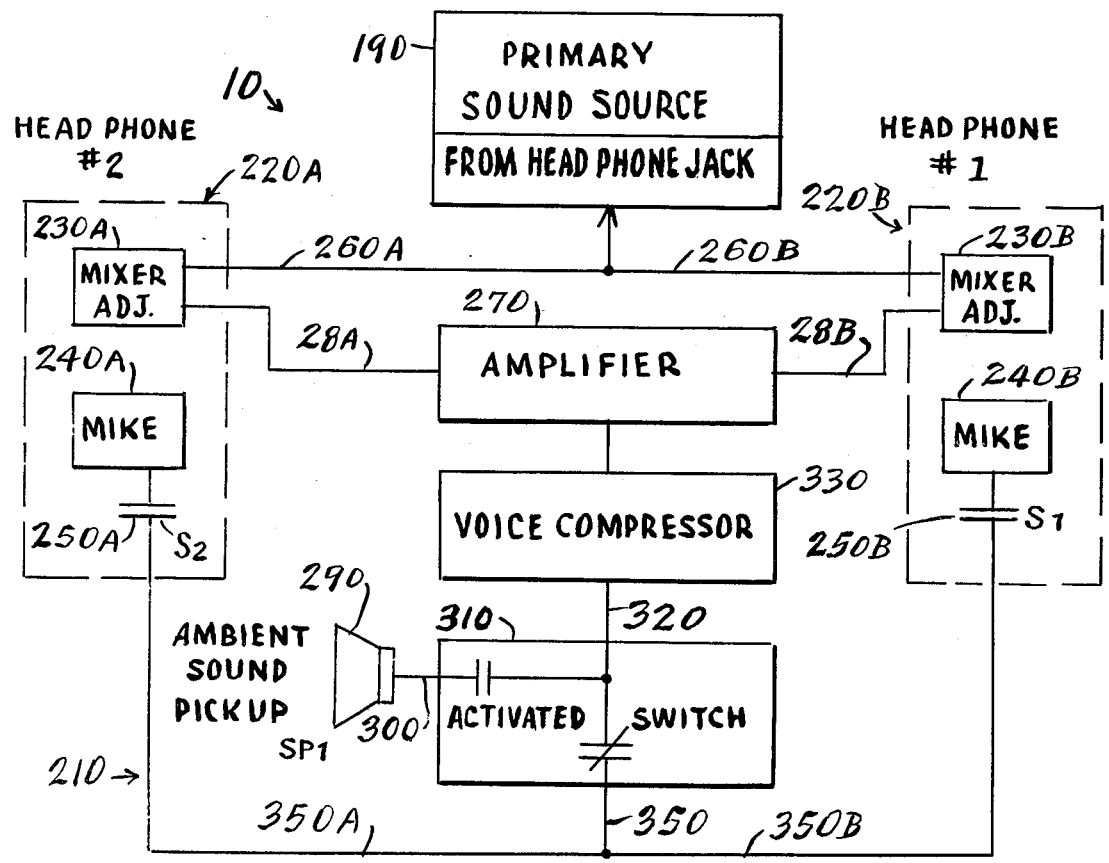
FIG-3-

MULTIPURPOSE HEADPHONE ASSEMBLY

BACKGROUND OF INVENTION AND DISCUSSION OF PRIOR ART

The subject invention pertains to the electronic art and particularly to those devices used in connection with headphones or headsets used for listening to stereophonic music or similar such sounds through a closed system. Moreover, this invention is applicable to devices used to interconnect communications between particular headphone assemblies in order that the respective users can communicate to one another through the headphone assemblies at desired intervals.

One of the problems encountered in the use of headphones used as a stereophonic system is that while the listener has the headphones on, he cannot hear extraneous noises such as doorbells, telephones, or other communications. Device for picking up such sounds are not known in the prior art, and yet it is desirable that such an apparatus be available and the reason for the desirability of such a device stems from the need to hear such extraneous raises in order to be aware whenever the telephone rings or the doorbell is sounded. The specific sound sources also need to be heard for appropriate action. When one has the earphones emplaced over the ears, these extraneous sound signals are completely obliterated, for practical purposes, and one cannot detect these signals. Moreover, it is desired as a concimmitment attribute to provide interconnecting communication means between headphone assembly users so as to allow the respective users to intercommunicate with their respective headphone assemblies.

There are no known electronic devices employed in the prior art which have been used to pick up such extraneous ambient sounds, and this invention is directed to such, and the following objects of the subject invention are directed accordingly.

OBJECTS

The following are objects of the subject invention:

It is an object of the subject invention to provide an improved stereophonic system headphone assembly;

Yet another object of the subject invention is to provide an electronic device for allowing specific ambient sounds to be picked up by a headphone set user while using such headphones.

Still another object of the subject invention is to provide an improved headphone assembly which allows the user to detect speeches outside noise signals;

A further object of the subject invention is to provide an improved headphone assembly for receiving communication from other headphone users interconnect to the same sound source;

Another aspect of the subject invention will be to provide an improved headphone apparatus for multipurpose usage;

Other and further objects of the subject invention will become apparent from a reading of the following description taken in conjunction with the drawings.

DRAWINGS

FIG. 2 is a circuit diagram of the sound pick-up apparatus;

FIG. 3 is a general schematic view of the overall system incorporating the features of the subject invention.

SUMMARY OF INVENTION

Figure 1:
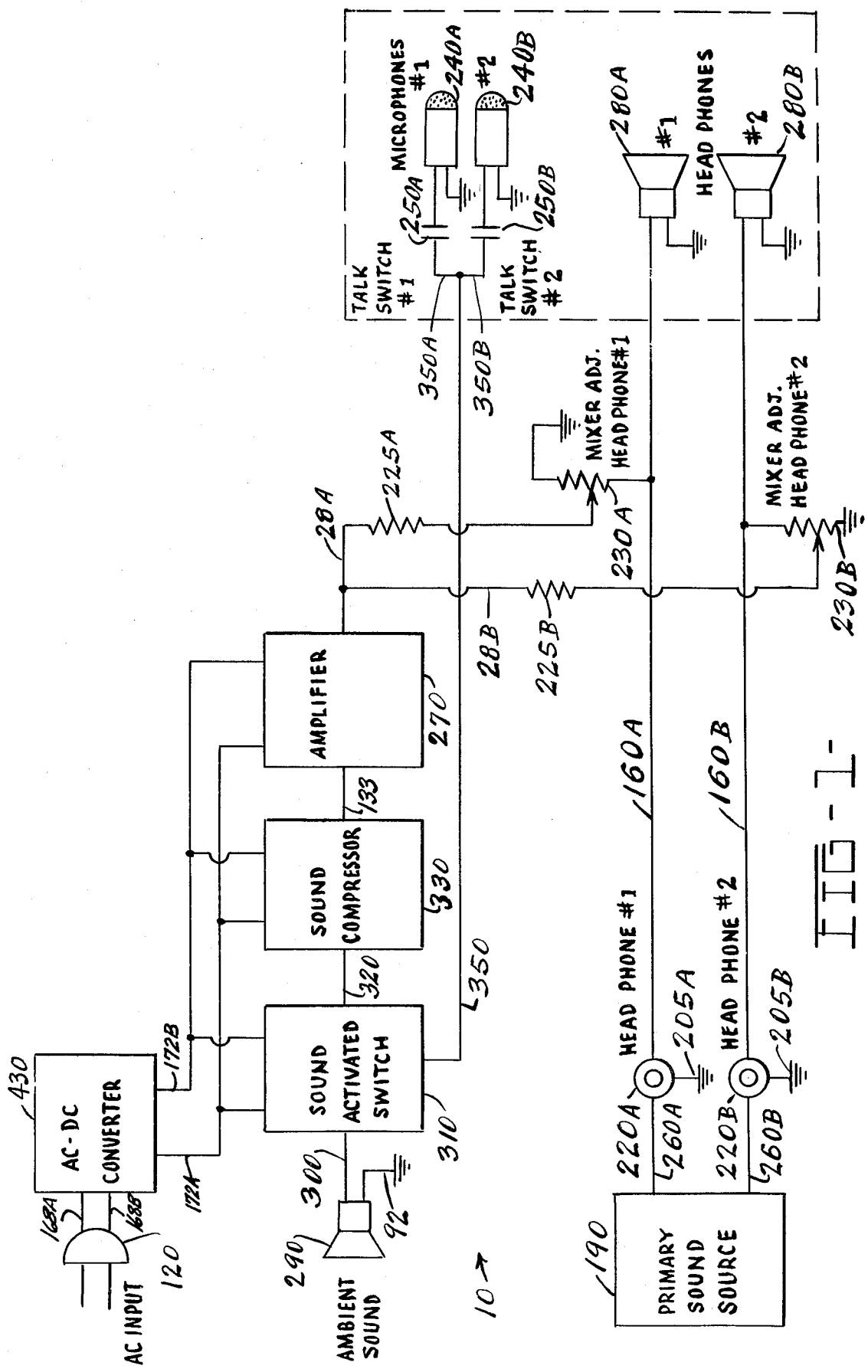
FIG. 1 is a specific schematic view of the overall system incorporating the subject invention.

The subject invention is conceived to perform two basic functions; one is the monitoring of ambient or extraneous noise signals while headphones are being worn for any type of electronic assembly, such as a stereophonic system. Such ambient sound cannot be normally heard when the headphone assembly is being used. The system is structured so that when an ambient sound of sufficient magnitude is detected, an automatically actuated switch allows such sound signal to be first compressed through the voice compressor, then amplified and directed through to the headphones to be heard by the listener. The listener need not actuate any switches, and can determine his course of action once such a signal is heard.

The second function of the system allows communication between the listeners through the headphones. When the first listener depresses his microphone switch and then speaks, the second listener will receive the speech mixed with the music. The system is reciprocated between all such headphones so inter-connected.

DESCRIPTION OF PREFERRED EMBODIMENT

Referring now to the drawings in which a preferred embodiment of the subject invention is shown, attention is first directed to FIG. 3 which is a general schematic of the overall electronic system 10 used. An overview of this total system 10 reveals two headphone assemblies 220A and 220B interconnected in such assembly, which headphone assemblies are of a conventional structural arrangement, except for the specific features of the subject invention incorporated therein, and more specifically described below. It is to be indicated herein that more than two headphone assemblies can be used in the system incorporating the principles of the subject invention. The description below will be directed to two headphones however, for purposes of description expediency. Moreover, the precise external configuration and specific electronic networks used in such assemblies is not of critical import, so long as the general features of the interconnected invention are equipped therewith.

Each headphone assembly 220A and 220B is provided with a headphone of the conventional type which is placed over the user's ears, with the conventional input features not shown, as these latter appurtenances are of general conventional structure and configuration. Further, each headphone assembly 220A and 220B includes, as part of the subject invention, a mixer adjustment 230A and 230B respectively integrally connected therein to microphones 240A and 240B respectively, as generally shown in FIGS. 1 and 3. Each microphone 240A and 240B is in turn directly connected to a switching assembly 250A and 250B which operates to turn on or off the microphone to which it is respectively connected, as shown. In addition, each headphone assembly 220A and 220B is connected to a headphone jack, not shown, through circuit 260, such headphone jack being integrally affixed to a stereophonic or other system to which the headphones 220A and 220B are connected.

As shown in FIG. 3, an amplifier assembly 270 is connected through circuits 28A and 28B to the respective headphones 220A and 220B. A sound receiver 290 is integrally placed in the system to pick up the specific ambient noises extraneous to the sounds generated in the stereophonic system connected to the headphones 220A and 220B through circuit 260, as shown. The sound receiver 290 may comprise any type of sound reception device so long as it is physically and electronically capable of detecting all types, levels, and characteristics of specific noise signals for input into the system 10. The sound receiver 290 is connected through circuit 300 to a sound activated switching apparatus 310 which serves to activate the ambient sound detector system. Electrical lead 320 extends to amplifier 270, with voice compressor assembly 330 being disposed along lead 320 between the switching apparatus 310 and amplifier 270, as represented in FIGS. 1 and 3. Circuits 350A and 350B lead from switching apparatus 310 to headphone switches 250A and 250B respectively. The specific construction and interrelationship of the foregoing elements in system 10 is more particularly described below.

Attention is now directed to the specific features of the apparatus shown in FIG. 1 in which system 10 is more particularly set forth. As shown, headphones 220A and 220B are interconnected through circuits 260A and 260B to headphone jacks of the primary sound source 190, which primary sound source may comprise a stereophonic system, or other such similar system. In this respect, the headphone jacks are shown as being connected integrally to the primary sound source 190 and appropriately grounded through ground connections 205A and 205B. As stated, headphone assemblies 220A and 220B are of general conventional configurations except as described hereinbelow.

The ambient sound receivor 290 is a standard device for conversion of mechanical sound energy to electrical energy, and is appropriately grounded at connection 92, as shown. The sound compressor 330 interconnected to the sound receivor 290 serves to compress the amplitude of signals for purposes of limiting the magnitude of such signals. This signal compressor 330 is also of conventional construction. Amplifier 270 functions to amplify the compressed signals which are generated through compressor 330 for signal reproduction purposes.

A conventional alternating current power source serves to provide the necessary electrical power to operate system 10, as shown in FIG. 1 through input source 120. A converter 430 is employed through parallel leads 168A and 168B connected to alternating current input source 120 to convert alternating current signals to direct current for purposes of operating system 10. The converter 430 is then directly interconnected to the activated switch assembly 310, the signal compressor 330, and the amplifier 270 through parallel circuits 172A and 172B, as shown, for purposes of directing resultant direct current signals for operating each of the foregoing specified units in system 10. As shown, the amplifier 270 is connected through circuits 28A and 28B, respectively to headphone assemblies 220A and 220B through mixer adjustments 230A and 230B respectively. Such mixer adjustments are basically rheostatic resistor assemblies with appropriate grounding devices. Mixer adjustments 230A and 230B can thus be manually manipulated to adjust the desired input mixture of respective noise volumes from the primary sound source and the ambient signals which are fed into the respective headphone assemblies. Alternately stated, the mixer adjustments 235A and 235B allow the respective headphone user to raise or lower either the primary sound signals relative to the ambient sound signals, and vice versa, as described.

The subject system includes, in addition to the foregoing elements, the inclusion of dual microphones 240A and 240B as schematically represented in FIG. 1. Each such microphone 275 and 275B is equipped with an integrally appended switch 250A and 250B respectively, disposed along leads 350A and 350B, which switches are manually operable. Each switch 250A and 250B, when closed, connects the input from each accompanying microphone 240A and 240B respectively, to be fed through circuit 350 to the sound activated switch assembly 310. From the latter assembly the signals from each such microphone 240A and 240B and directed through signal compressor 330, thence to amplifier 270 before being directed to the respective headphones 220A and 220B in system 10.

References are now made in particular to FIG. 2, in which the elements comprising the sound activated switch 310 are particularly represented. In this regard, the sound activated switch 310 is comprised of a sensitivity adjustment unit 380, directly connected to lead 300, which draws from the ambient sound receptor 290. The sensitivity unit 360 is connected to audio amplifier 370 transistor for amplification of signals received into the ambient sound receptor 290, as shown. The signals, once so amplified, are then directed through parallel circuits 380A and 380B. Signals passing through circuit 380B are directed through capacitor discharge transistor 414 to regulate the monostable vibrator 405. Signals directed through circuit 380 are bifurcated through an internal potentiometer 445 for time delay of signals, which is set normally about five seconds, with the other signal passing through to the vibrator 405. A fifteen volt power source 450 is connected to parallel circuits 280A and 280B to provide power for the sensitivity adjustment unit, as shown. A relay unit 500 is used to connect the output from the microphones 240A and 240B to the voice compressor 330, as shown, and described above. With the foregoing, an automatic feed in of extraneous noises enables the user to receive and detect the quality of such noises; and the respective users can intercommunicate, at will. Through the indicated microphone switch assembly.

While a preferred embodiment of the subject invention has been shown, it shall not be considered as limiting the scope of the subject invention.

I claim:

1. A multipurpose headphone assembly comprising in combination the following elements:
   (a) a power source; connected by electrical leads to the headphone assembly;
   (b) an alternating to direct current converter assembly connected to the power source;
   (c) a sound activated switch assembly connected to the convert assembly;
   (d) a sound compressor assembly connected to the converter assembly;
   (e) an amplifier connected to the convert assembly;
   (f) electrical means connecting the sound activated switch assembly with the sound compressor and amplifier;
   (g) a primary sound source with a plurality of headphone assemblies interconnected thereto; connected by electrical lead to the headphone assembly;
   (h) microphone assemblies interconnected to each of the headphone assemblies and connected with the sound activated swith assembly;
   (i) electrical means connecting the amplifier with each headphone assembly;
   (j) manual switch means to cut off extraneous signals.

* * * * *